United States Patent [19]
Drake, Jr.

[11] Patent Number: 6,094,447
[45] Date of Patent: Jul. 25, 2000

[54] SYSTEM AND METHOD FOR REDUCING WAVEFRONT DISTORTION IN HIGH-GAIN DIODE-PUMPED LASER MEDIA

[75] Inventor: Thomas E. Drake, Jr., Fort Worth, Tex.

[73] Assignee: Lockheed Martin Corporation, Fort Worth, Tex.

[21] Appl. No.: 09/096,791

[22] Filed: Jun. 12, 1998

[51] Int. Cl.[7] .............................. H01S 3/091; H01S 3/094
[52] U.S. Cl. .............................................................. 372/75
[58] Field of Search ........................................ 372/70, 75

[56] References Cited

U.S. PATENT DOCUMENTS

| | | | |
|---|---|---|---|
| 5,337,325 | 8/1994 | Hwang | 372/75 |
| 5,748,654 | 5/1998 | Marabella et al. | 372/75 |
| 5,761,234 | 6/1998 | Craig et al. | 372/75 |
| 5,854,805 | 12/1998 | Reid et al. | 372/75 |
| 6,016,324 | 1/2000 | Rieger et al. | 372/75 |

*Primary Examiner*—Teresa M. Arroyo
*Assistant Examiner*—Robert E. Wise
*Attorney, Agent, or Firm*—Gray Cary Ware & Freidenrich, LLP

[57] ABSTRACT

A system and method for reducing wavefront distortion in high-gain diode-pumped laser media by providing a non-uniform current profile to be delivered to a pumping array comprised of laser diodes distributed on a laser medium. A signal processor provides for partitioning an electric current emitted from a diode driver such that the pumping array receives a non-uniform current profile resulting in a controlled thermal gradient near the periphery of the laser substrate. By controlling this thermal gradient at the region where an exit laser beam leaves the laser medium, the thermally-induced exit beam distortion is minimized.

20 Claims, 4 Drawing Sheets

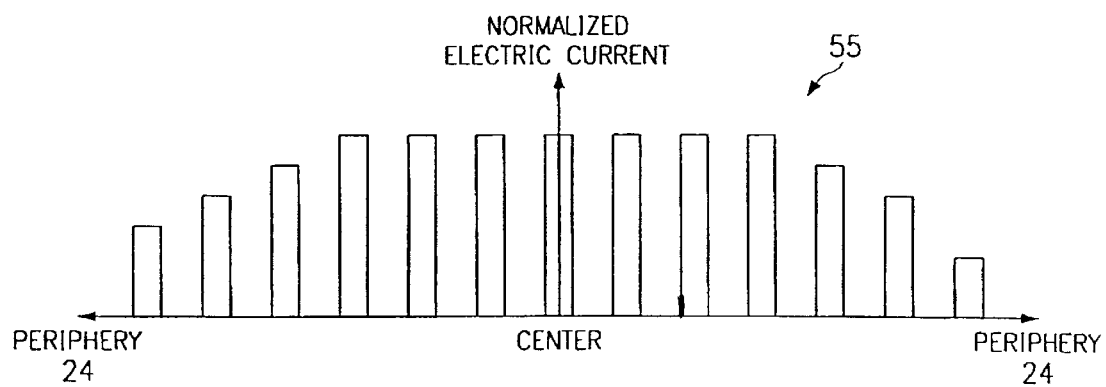
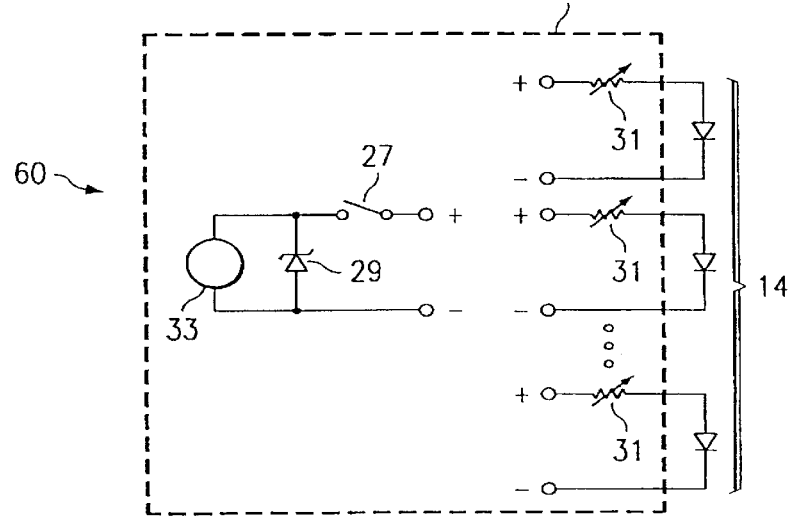

SYSTEM AND METHOD FOR REDUCING WAVEFRONT DISTORTION IN HIGH-GAIN DIODE-PUMPED LASER MEDIA

TECHNICAL FIELD OF THE INVENTION

The present invention relates generally to a system and method for reducing wavefront distortion in solid-state optical light sources, and more particularly, to a system and method for reducing distortion of optical wavefronts emitted from high-gain diode-pumped laser media which are commonly used in a multitude of applications including telecommunication and material processing devices and systems.

BACKGROUND INFORMATION

Amplification of laser light is required for a variety of applications. Long haul telecommunication applications, such as those employing single mode optical fiber, often require optical repeater/amplifiers to boost sagging signal levels. Material processing applications may require very high power laser light to perform functions such as cutting of various materials and preparation of material surfaces. Optical pumping of a solid state laser medium is a common and conventional method used to create a population inversion of energy states for laser applications requiring high-gain.

The laser medium providing this high-gain may comprise a material such as neodymium yttrium-aluminum garnet ($Nd^{3+}$:YAG) or Erbium doped optical fiber ($Er^{3+}$:silica), but it is well known in the art that any suitable material capable of maintaining an inverted population of energy states when optically-pumped will suffice. Those laser media utilizing $Nd^{3+}$:YAG are common, given the substantial optical gain near desired wavelengths near the 1.064 μm range. Additionally, $Nd^{3+}$:YAG laser media provide linearity of pumping rate with respect to inverted population given its four-level transition system that is also well known to those skilled in the art.

To saturate an entire laser medium with an inverted population through optical pumping, a conventional method is to distribute a large array of laser diodes across the surface of the laser medium to form a pumping array. The light emitted from the individual laser diodes of the pumping array excites the laser medium and provide a very high optical gain for the energy transition level of the optically-pumped, inverted population within the high-gain laser medium, e.g., near the 1.064 μm range for $Nd^{3+}$:YAG, near the 1.55 μm range for $Er^{3+}$:silica, etc.

FIG. 1A (prior art) depicts a conventional, optically-pumped high-gain laser system 10. The pumping array shown in FIG. 1A is a one-dimensional array, but a two-dimensional array could also be used without departing from the scope and spirit of the invention. The conventional configuration comprises a laser medium 12, on which an array of laser diodes are distributed to form a pumping array 14. The pumping array is powered by a diode driver 16 which delivers electric current to the laser diodes of the pumping array to optically excite the laser medium 12 to produce the desired high optical gain; the light emitted from the pumping array 18 is, ideally, distributed throughout the entire laser medium 12. Different embodiments are used in the conventional system to generate the initial light beam that is to be amplified. FIG. 1A depicts a seed laser beam 20 being injected into the laser medium 12, which then undergoes amplification before exiting as an exit beam 22 for some desirable and useful purpose. As shown in FIG. 1B (prior art), the output optical power of the laser diodes 18 is proportional to the electric current delivered to the pumping array 14 above the lasing threshold of the laser diodes comprising the pumping array.

This conventional configuration delivers an electric current profile across the entire pumping array to create, ideally, a homogenous energy state population inversion throughout the laser medium. Typically, all the laser diodes in the pumping array receive exactly the same amount of electric current, resulting in a uniform current profile 21 across the pumping array (see FIG. 2A, prior art).

Often the pumping array is already integrated onto the laser medium with internal electric circuitry which partitions the current evenly among the various laser diodes of the pumping array 14, and the user must simply provide a single electric current from a diode driver 16. A typical electric circuit which would provide for such even electric current partition is shown in FIG. 2B (prior art). A voltage supply 26, capable of providing a voltage of nominally 2n V, is connected across the laser diodes of the pumping array 14, wherein n is the number of laser diodes within the pumping array. A switch 27 and a current limiting resistor 28 are connected in series with the laser diodes of the pumping array 14 to protect the pumping array from overcurrents and to provide on/off operation of the pumping array. A Zener diode 29 may be used to provide reverse voltage protection of the laser diodes of the pumping array. The breakdown knee voltage of the Zener diode 29 may be appropriately chosen to ensure that a reverse voltage is never applied across the terminals of the pumping array. This electrical configuration is merely exemplary of a method which may be used to deliver the conventional uniform current profile across all of the laser diodes of the pumping array 14.

While the conventional configuration is simplistic in its application and ease of operation in that a single electric current may be applied to the device, one resultant problem from employing this conventional method of a uniform electric current profile 21 across the entire pumping array 14 is from the steep and short thermal transition zone at the periphery 24 of the laser medium 12 (see FIG. 1A, prior art). This steep and short transition zone between the optically-pumped region and the un-pumped region results in a large thermal gradient near the periphery 24 of the laser medium.

This large thermal gradient near the periphery 24 of the laser medium 12, combined with the large thermal dependence of the refractive index of the laser medium 12 result in a distorted optical medium at the periphery 24. The exit beam 22 leaves the laser medium 12 at this thermally distorted periphery 24, resulting in wavefront distortion of the exit beam 22. These wavefront distortions are caused primarily from the temperature dependence of the index of refraction in the lasing medium. This phenomena often limits the total power that can be extracted from a lasing medium while maintaining a beam of acceptable quality.

The distortion of exit beam 22 may result in a poor quality spatial mode, unsuitable for coupling into a single mode optical fiber, resulting in either very lossy coupling or modal dispersion during transmission of the light beam within telecommunication applications.

The distortion of the exit beam 22 may also result in unstable beam pointing performance which is very undesirable for material processing applications where great accuracy is required for either precision cutting of specialty components or material surface preparation.

Additionally, for high frequency switching applications, high pulse rates may result in greater distortion of the exit beam 22. This effect may seriously limit the performance of the laser in terms of maximum output power while operating at high frequency pulse rates. An operating trade-off may result in which pulse rate and output power must be balanced.

Also, the amount of distortion of the exit beam is often non-linear with respect to increasing pulse rate. Without incorporating some additional compensatory system, a single, scaleable design capable of use in a variety of applications which may require widely varying pulse rates are virtually impossible to construct.

Systems which provide for launching light into a fiber at very high power levels and high pulse rates often incorporate a compensatory lens system to ensure focus of the exit beam 22 at high pulse rates, as the exit beam 22 distortion is greatly accentuated at high pulse rates. If the pulse rate is then decreased and the high power level is maintained, the frequency-induced exit beam 22 distortion is lessened, but the compensatory lens system continues to focus the exit beam which is of higher quality at lower pulse rates, thereby creating a very high exit beam 22 power density which can damage the optical fiber face.

In general, the wavefront distortions problems arise from the fact that the surface of the laser medium, when undergoing a very steep and short thermal gradient, results in a distorted medium through which the exit beam 22 must pass. This invariably results in distortion of the exiting wavefront which gives deleterious residual effects in a wide variety of applications.

SUMMARY OF THE INVENTION

The present invention provides a system and method for reducing the distortion of an exit beam wavefront emitted from a high-gain laser medium. Specifically, a purpose of the present invention is to reduce or minimize wavefront distortions created by the effects of optical pumping-induced thermal gradients in solid-state amplifying materials.

The present method incorporates a pumping array comprised of laser diodes distributed across a laser medium. The electric current to be delivered to the pumping array is provided by a diode driver, and the present invention also employs a signal processor which partitions the current among the various laser diodes of the pumping array. The present invention may comprise a divider network for unequally partitioning the electric current from the diode driver to the various laser diode bars in the pumping array, thereby providing a non-uniform pumping profile. Those skilled in the art may envision a multitude of signal processor circuits which would provide for dividing an electric current into unequal amounts.

The signal processor allows the user to control the shape of the current profile which is delivered to the pumping array, thereby providing a non-uniform current profile to the pumping array. By delivering a non-uniform current profile to the pumping array with the signal processor, the user may create a longer and less steep thermal transition zone between the optically-pumped region and the un-pumped region which reduces the distortion of the exit beam from the laser medium.

Many various non-uniform current profiles may be envisioned and implemented without departing from the spirit and scope of the invention. For example, the region of much concern is the periphery of the laser medium. Those skilled in the art may envision an optimal non-uniform current profile for operating the system, be it a parabolic, 3rd order, or exponential current profile. The present invention provides for the novel use of a non-uniform current profile to reduce wavefront distortion in high-gain diode-pumped laser media, and the non-uniform current profiles suggested in this invention are exemplary of non-uniform profiles and not an exhaustive set of profiles which may be employed in the present invention.

A monitoring feedback system may also be incorporated to control this thermal gradient at the periphery of the laser medium by varying the non-uniform current profile in real time. The monitoring feedback system may determine an aspect of the laser medium itself, i.e. the temperature distribution across the laser medium, and process that information to change the non-uniform current profile for performing any number of functions including maximizing efficiency or maximizing output power of the exit beam. Similarly, the monitoring feedback system may determine an aspect of the exit beam, i.e. the divergence of the exit beam, and process that information to change the non-uniform current profile for performing any number of functions including enhanced beam steering or optical coupling efficiency.

The wavefront quality of a laser is of primary importance for many laser applications. The advantages of the present invention are inherent by providing a more uniform wavefront, which is desirable for a host of applications. One problem that the present invention addresses is the elimination or reduction of wavefront distortion by providing laser beams of higher quality, particularly at higher powers levels and higher pulse rates. Without employing some thermal compensatory system, laser media employing the conventional method of uniform current profile pumping often possess non-linearity of wavefront uniformity as exit beam power increases to very high levels.

Another problem which the present invention addresses is the non-linearity of wavefront uniformity as a function of increasing pulse rate, particularly for high frequency applications. The present invention provides for a system which is scaleable across a broad frequency spectrum while maintaining consistent wavefront quality. The present invention obviates the need for dynamically adjustable compensatory focusing lenses for applications such as launching light into an optical fiber which require tightly focused beams which may inherently vary greatly as a function of pulse rate and exit beam power for various applications.

The present invention provides a system that is scaleable across a large dynamic range of exit beam power and broad frequency spectrum of pulse rate while providing a consistent wavefront quality.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein:

FIG. 5B shows another current profile exemplary of a non-uniform current profile FIG. 6A shows an electric circuit capable of delivering a non-uniform current profile to a pumping array.

DETAILED DESCRIPTION OF THE INVENTION

Preferred embodiments of the present invention are illustrated in the FIGURES, like numerals being used to refer to like and corresponding parts of the various drawings.

The present invention overcomes problems associated with thermal gradients across optically-pumped laser media. The thermal gradient problem is normally accentuated near the periphery of laser media where there is a short and steep transition zone between the optically-pumped and un-pumped regions of the laser medium. Typically, the laser diodes are distributed across the laser medium to form a pumping array. By delivering varying amounts of electric current to the individual laser diodes of the pumping array, particularly near the periphery of the laser medium, the pumping-induced thermal gradient near the periphery is lessened, resulting in a reduction of thermally-induced wavefront distortion of an exit laser beam.

Figure 1A:
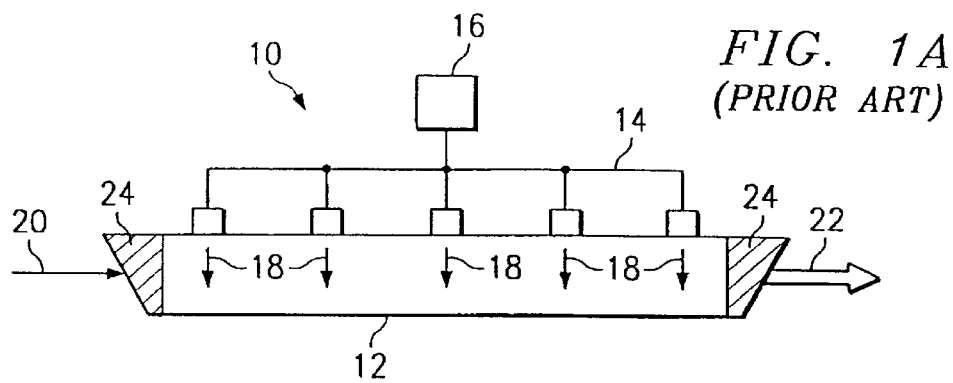
FIG. 1A shows a prior art, conventional arrangement of a high-gain diode-pumped laser employing the present state of the art method for uniform current pumping wherein a seed laser beam is provided by an external light source.
Figure 1B:
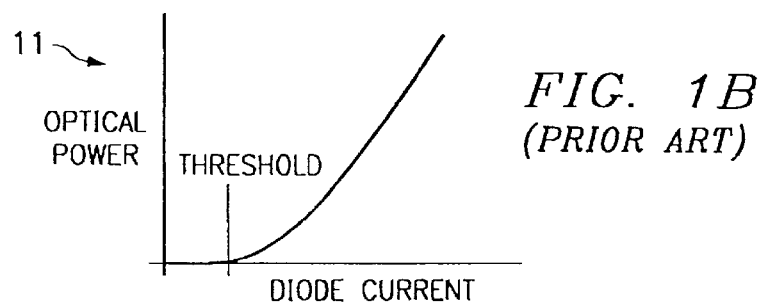
FIG. 1B shows the relationship between the optical power of the laser diodes and the electric current used to drive the pumping array.
Figure 3:
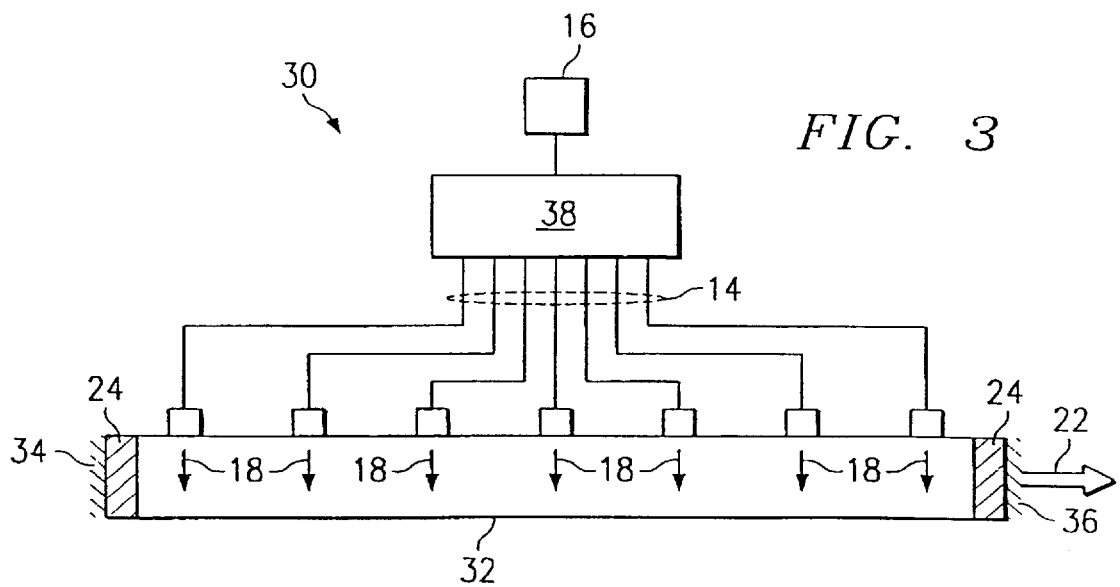
FIG. 3 shows an embodiment of the present invention employing a non-uniform current profile wherein the laser medium is an optical oscillator and operates via spontaneous emission.

FIG. 3 shows one configuration of a high-gain diode-pumped laser system 30 which delivers a non-uniform current profile to a laser medium 32. In the embodiment shown, the laser medium 32 is itself a Fabry-Perot optical resonator. Lasers operating using a conventional Fabry-Perot cavity in which one end of the resonator a fully reflecting mirror 34 and the other end of the resonator is a partially reflecting mirror 36 are well known in the art. The laser medium of this embodiment could also be of the type shown in FIG. 1A in which a seed laser beam 20 is provided by an external source. A number of various configurations comprising an optically-pumped laser medium may be envisioned without departing from the spirit and scope of the present invention.

A diode driver 16 delivers an electric current to a signal processor 38 which partitions the electric current before delivering it to the various laser diodes of the pumping array. In the embodiment shown, the signal processor 38 electrically connects to each of the laser diodes comprising the pumping array 14, thereby providing individual control of the relative current delivered to each of the laser diodes.

The electric current from a diode driver 16 is partitioned using any number of conventional signal processing schemes. One such scheme could be a simple current divider circuit in which each section of the divider circuit connected to a single laser diode in the pumping array 14. The present configuration shows a signal processor 38 capable of delivering varying amounts of electric current to the laser diodes which comprise the pumping array 24. The light 18 emitted from laser diodes of the pumping array 14 optically pump the laser medium 32 to create a population inversion resulting in high optical gain. In the embodiment shown, the high optical gain acts upon a lightwave generated via spontaneous emission in the Fabry-Perot optical resonator cavity which results in exit beam 22 which is highly amplified. The exit beam 22 leaves the laser medium 32 through the partially reflecting mirror 36 at the periphery 24 of the laser medium 32.

The signal processor provides for controlling the relative distribution of the electric current provided by the diode driver 16 among the laser diodes of the pumping array 14. Such control results in a current profile across the laser medium corresponding to the distribution of electric current provided by the diode driver 16 that is delivered to the pumping array 14. This current profile can be modified to be a non-uniform current profile which results in reduction of wavefront distortion of exit beam 22. Wavefront distortion of exit beam 22 is caused primarily from the large thermal gradient near the periphery 24 of the laser medium 32 within the short transition zone between the optically-pumped and un-pumped region of the laser medium 32. Employing a non-uniform current profile permits the controlling of the optical pumping-induced thermal gradient near the periphery 24 to provide a longer and less steep thermal transition zone between the pumped and un-pumped region of the laser medium. This, in turn, provides for a less pronounced thermal variation of the periphery 24 which is precisely where the exit beam 22 leaves the laser medium 32.

As the refractive index of laser media is acutely sensitive to variations in temperature, the shorter this thermal transition zone near the periphery 24 of the laser medium 32, the greater the distortion of the wavefront of the exit beam 22. By controlling the shape of the current profile delivered to the pumping array 14, a longer and less steep thermal transition zone is created resulting in reduction of wavefront distortion of exit beam 22. A gradually decreasing current profile would provide a gradually decreasing thermal gradient through the thermal transition zone between the optically-pumped and un-pumped region of the laser medium, thereby resulting in less wavefront distortion of exit beam 22.

Figure 4:
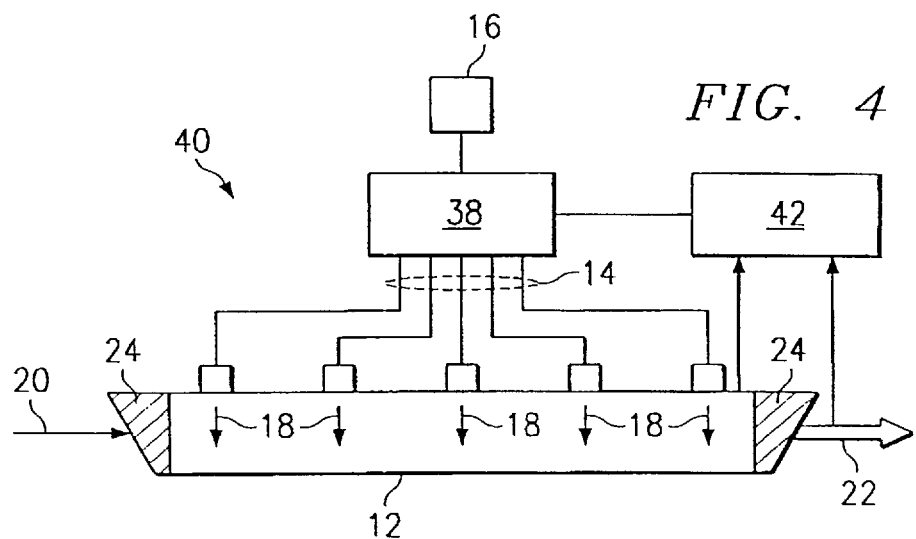
FIG. 4 shows an embodiment of the present invention employing a non-uniform current profile wherein a seed laser beam is provided by an external light source and further employing a monitoring feedback system.

FIG. 4 shows another configuration of a high-gain diode-pumped laser system 40 which delivers a non-uniform current profile to a laser medium 12. The laser medium 12 shown in this configuration is similar to that shown in FIG. 1A in that a seed laser beam 20 is provided by an external light source. The laser medium of this configuration could also be of the type shown in FIG. 3 which comprises a conventional Fabry-Perot optical resonator. As iterated above, a number of various configurations comprising an optically-pumped laser medium may be envisioned without departing from the spirit and scope of the present invention.

The configuration depicted in FIG. 4 is similar to that of FIG. 3 in that a diode driver 16 delivers electric current to a signal processor 38 which then partitions that electric current among the laser diodes comprising a pumping array 14 distributed across the laser medium 12. The light 14 emitted from laser diodes of the pumping array 18 optically pump the laser medium 32 to create a population inversion resulting in high optical gain.

To assist further in delivering a non-uniform current profile to the pumping array 14, a monitoring feedback system 42 monitors information of at least one aspect of both or either exit beam 22 or laser medium 12 and utilizes that information to adjust the current profile delivered to pumping array 14 in real time. Such properties of exit beam 22 may be aspects such as intensity or divergence. Such aspects of laser medium 12 may be temperature distribution or optical pumping rate. For both elements, those skilled in the art could envision a number of aspects which might be monitored to provide information to adjust the current profile in response to that aspect.

By providing real time control to the current profile delivered to pumping array 14 in response to aspects of the operating system, the abruptness of the thermal transition zone near the periphery 24 of the laser medium 12 is greatly decreased, thereby reducing the wavefront distortion of exit beam 22 as it leaves the laser medium 12.

Figure 5A:
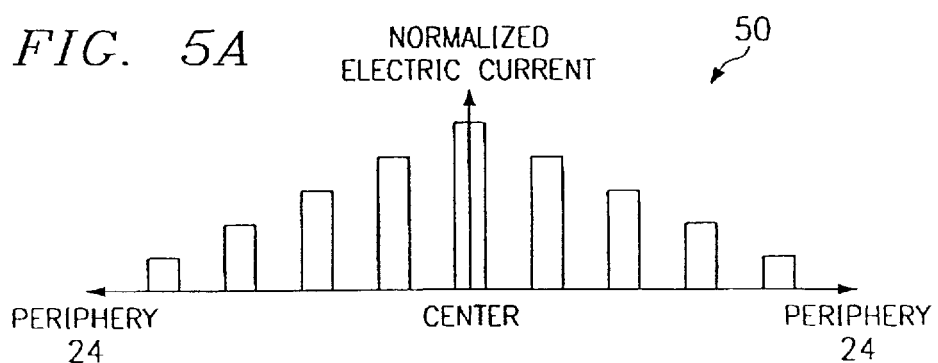
FIG. 5A shows a current profile exemplary of a non-uniform current profile.

FIG. 5A shows a non-uniform current profile 50 which could be delivered to a pumping array comprising a number of laser diodes. The distinguishing characteristic of the non-uniform current profile is that the relative amount of current delivered to the laser diodes comprising the pumping array 14 decreases near the periphery 24 of the laser medium 12. Any number of laser diodes could comprise the pumping array 14, and the fact that only nine are shown in FIG. 5A in no way departs from the spirit and scope of the invention. FIG. 5A is merely exemplary of one distribution of electric current which provides a non-uniform current profile.

FIG. 5B shows another non-uniform current profile 55 which could be delivered to a pumping array comprising a number of laser diodes. As iterated with respect to FIG. 5A, the distinguishing characteristic of the non-uniform current profile is that the relative amount of current delivered to the laser diodes comprising the pumping array 14 decreases near the periphery 24 of the laser medium 12. Also as iterated with respect to FIG. 5A, any number of laser diodes could comprise the pumping array 14, and the fact that only thirteen are shown in FIG. 5B in no way departs from the spirit and scope of the invention. FIG. 5B is merely exemplary of another possible distribution of electric current which provides a non-uniform current profile.

FIG. 6A shows one possible electric circuit configuration 60 of a diode driver 16 which may deliver a non-uniform current profile to the laser diodes of a pumping array 14. A voltage source 33, capable of providing the voltage required to operate a single laser diode while delivering sufficient electric current to all of the laser diodes of the pumping array 14, is connected in parallel to the various laser diodes of the pumping array through a switch 27 for providing on/off operation of the pumping array 14. A variable current limiting resistor 31 may be connected in series with each laser diode of the pumping array for providing variable control of the electric current delivered to each laser diode and thereby controlling the shape of the current profile across the pumping array 14. Also, a Zener diode 29 may be used to provide reverse voltage protection of the laser diodes of the pumping array if desired. The electric circuit shown in FIG. 6A could provide the non-uniform electric current profile shown in FIG. 5A if desired. The electric circuit shown in FIG. 6A is merely exemplary of one manner of delivering a non-uniform electric current profile to the laser diodes of a pumping array. Various methods for partitioning electrical current are known to those skilled in the art.

Figure 2A:
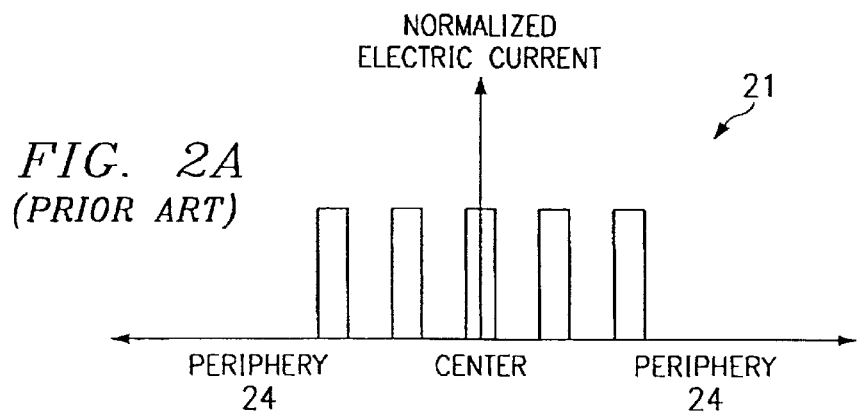
FIG. 2A shows a prior art, conventional uniform current profile wherein the same amount of electric current is delivered to all of the laser diodes within the pumping array distributed from the center to the periphery of the laser medium.
Figure 2B:
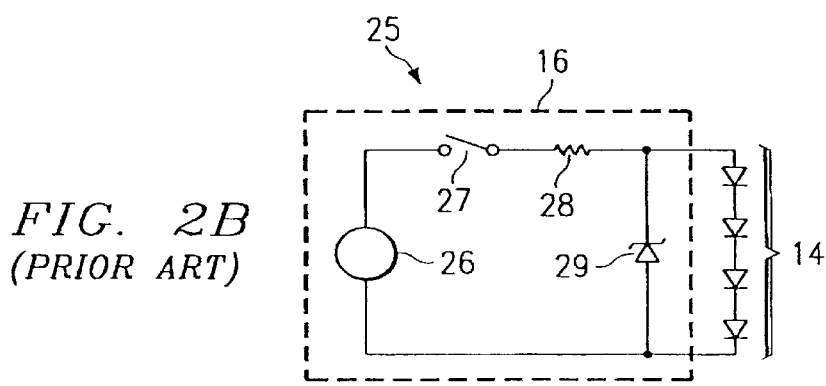
FIG. 2B shows a prior art, conventional electric circuit for delivering the same amount of electric current to all of the laser diodes within the pumping array.
Figure 6B:
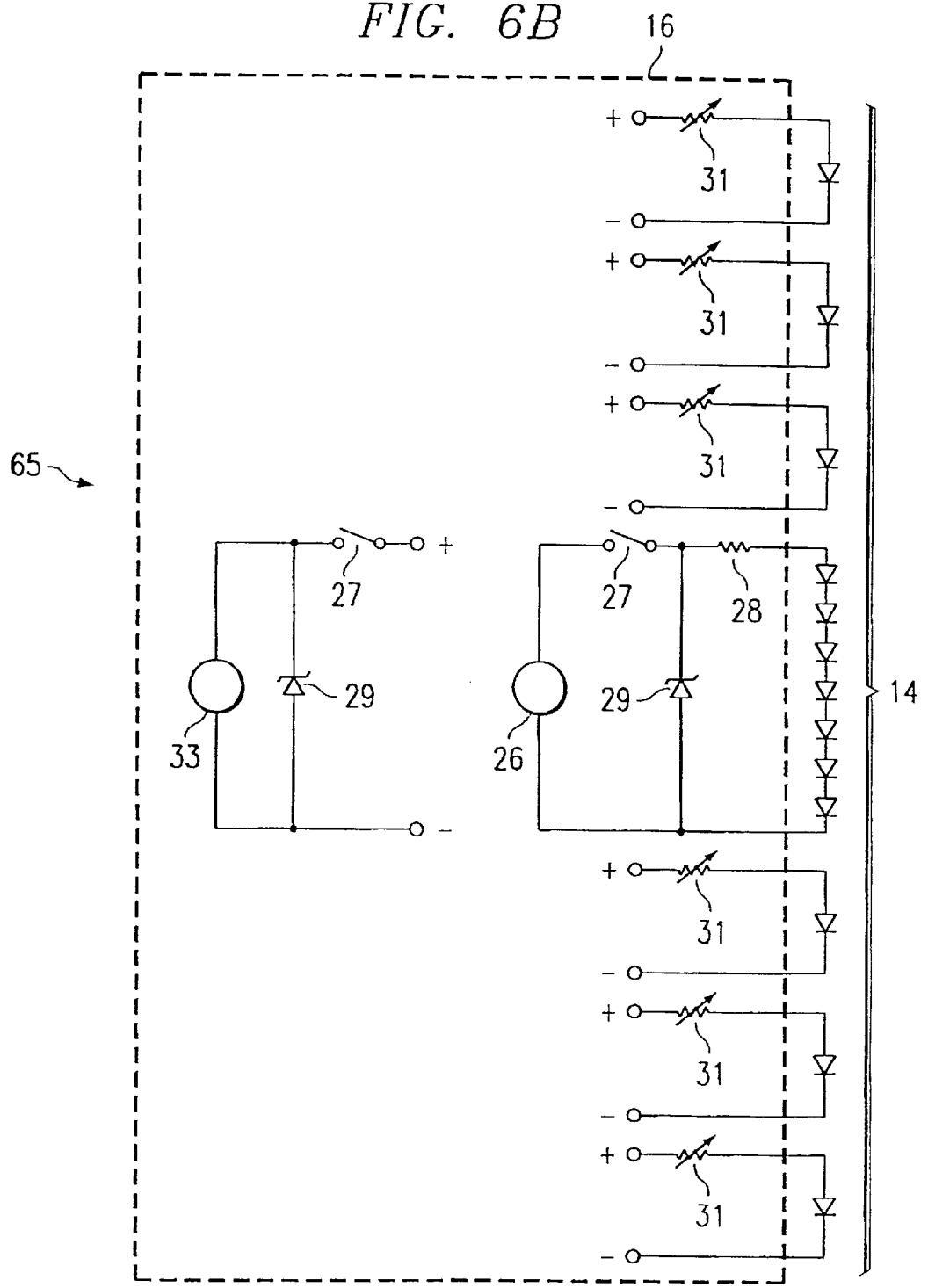
FIG. 6B shows an electric circuit capable of delivering a uniform current profile to selected laser diodes of a pumping array and a non-uniform current profile to the remaining laser diodes of the pumping array.

FIG. 6B shows another electric circuit 65 capable of providing a non-uniform electric current profile to the laser diodes of a pumping array. In this configuration, the diode driver 16 comprises a uniform driver similar to that shown in FIG. 2B and a non-uniform driver similar to that shown in FIG. 6A. The two may be integrated together for reducing the number of electrical components required and to decrease the cost of the electric circuit required to drive the pumping array 14.

A first voltage supply 26, capable of providing a voltage of nominally 2n V, is connected across n laser diodes of the pumping array 14. A switch 27 and a current limiting resistor 28 are connected in series with the n laser diodes of the pumping array 14 for protection and to provide on/off operation of the pumping array. A Zener diode 29 may be used to provide reverse voltage protection of the n laser diodes of the pumping array. A second voltage supply 33, capable of providing the voltage required to operate a single laser diode while delivering sufficient electric current to the remaining laser diodes of the pumping array 14, is connected in parallel to each of the remaining laser diodes of the pumping array through a switch 27 for providing on/off operation of the pumping array 14. A variable current limiting resistor 31 may be connected in series with each remaining laser diode of the pumping array driven by the second voltage source for providing variable control of the electric current delivered to each laser diode. Also, a Zener diode 29 may be used to provide reverse voltage protection of the remaining laser diodes of the pumping array if desired.

By providing this dual control of the laser diodes of the pumping array 14 through these two electric circuits, the shape of the current profile across the pumping array 14 may be adjusted to provide a non-uniform current profile similar to that shown in FIG. 5B. This electrical configuration, employing one electrical circuit capable of delivering a uniform current profile to a pre-determined number of laser diodes of the pumping array 14 and an electrical circuit capable of delivering a non-uniform current profile to the remaining laser diodes of the pumping array 14, is merely exemplary of a method which may be used to deliver the non-uniform current profile. Various methods for partitioning electrical current are known to those skilled in the art.

In summary, the present invention provides a system and method for reducing wavefront distortion in high-gain diode-pumped laser media. The present invention comprises a high-gain laser medium, a pumping array comprising a multiplicity of laser diodes distributed across the high-gain laser medium, a diode driver for providing an electric current to operate the laser diodes for optically pumping the high-gain laser medium, and a signal processor for partitioning the electric current delivered to the pumping array to provide a non-uniform current profile to the pumping array for providing a thermal gradient across the periphery of said high-gain laser medium. The present invention provides a system that is scaleable across a large dynamic range of exit beam power and broad frequency spectrum of pulse rate while providing a consistent wavefront quality.

Although the present invention has been described in detail, it should be understood that various changes, substitutions and alterations can be made hereto without departing from the spirit and scope of the invention as described by the appended claims.

What is claimed is:

1. A system for reducing wavefront distortion in high-gain diode-pumped laser media comprising:

a high-gain laser medium;

a pumping array comprising a multiplicity of laser diodes distributed across said high-gain laser medium;

a diode driver for providing an electric current to operate said multiplicity of laser diodes for optically pumping said high-gain laser medium; and a signal processor for partitioning said electric current among each laser diode within said pumping array to deliver a non-uniform current profile to said pumping array for providing a thermal gradient across the periphery of said high-gain laser medium.

2. The system of claim 1, further comprising a seed laser beam injected into said high-gain laser medium from an external light source.

3. The system of claim 1, wherein said high-gain laser medium consists essentially of an optical resonator for generating an exit laser beam via spontaneous emission.

4. The system of claim 1, wherein said thermal gradient across the periphery of said high-gain laser medium comprises a gradual thermal gradient.

5. The system of claim 1, wherein said thermal gradient across the periphery of said high-gain laser medium comprises a gradual thermal gradient and further comprising a monitoring feedback system for determining at least one aspect of said high-gain laser medium for real time adjustment of said non-uniform current profile in response to said at least one aspect of said high-gain laser medium.

6. The system of claim 1, wherein said thermal gradient across the periphery of said high-gain laser medium comprises a gradual thermal gradient and further comprising:
a laser beam emitted from said high-gain medium; and
a monitoring feedback system for determining at least one aspect of said laser beam for real time adjustment of said non-uniform current profile in response to said at least one aspect of said laser beam.

7. The system of claim 1, wherein said signal processor for partitioning said electric current uses a plurality of predetermined non-uniform current profiles.

8. The system of claim 1, wherein said signal processor for partitioning said electric current uses a plurality of predetermined non-uniform current profiles and switches among various profiles within said plurality of predetermined non-uniform current profiles in real time.

9. The system of claim 1, wherein said pumping array comprises a two-dimensional array of laser diodes.

10. The system of claim 1, wherein said laser diodes comprise laser diode bars.

11. A system for reducing wavefront distortion in high-gain diode-pumped laser media comprising:
a high-gain laser medium;
a seed laser beam injected into said high-gain laser medium from an external light source;
a pumping array comprising a multiplicity of laser diodes distributed across a surface of said laser medium wherein said laser diodes are laser diode bars;
a diode driver for providing an electric current to operate said multiplicity of laser diodes for optically pumping said high-gain laser medium;
a signal processor for partitioning said electric current among each laser diode within said pumping array to deliver a uniform current profile to laser diodes inside of the periphery of said surface of said high-gain laser medium and a non-uniform current profile to said pumping array for providing a gradual thermal gradient across the periphery of said surface of said high-gain laser medium;
a laser beam generated from amplified said seed laser beam emitted from said high-gain medium; and
a monitoring feedback system for determining at least one aspect of one of either said laser beam or said high-gain laser medium for providing real time adjustment of said non-uniform current profile in response to said at least one aspect.

12. A method for reducing wavefront distortion in high-gain diode-pumped laser media comprising:
electrically connecting a diode driver to a pumping array comprising a multiplicity of laser diodes distributed across a laser medium;
emitting an electric current from said diode driver;
partitioning said electric current using a signal processor to create a non-uniform current profile to be delivered to said pumping array; and
delivering said non-uniform current profile to said pumping array for providing a thermal gradient across the periphery of said high-gain laser medium.

13. The method of claim 12, further comprising injecting a seed laser beam into said high-gain laser medium from an external light source.

14. The method of claim 12, wherein said high-gain laser medium consists essentially of an optical resonator for generating an exit laser beam via spontaneous emission.

15. The method of claim 12, further comprising controlling said thermal gradient across the periphery of said high-gain laser medium to provide a gradual thermal gradient.

16. The method of claim 12, further comprising:
controlling said thermal gradient across the periphery of said high-gain laser medium to provide a gradual thermal gradient;
monitoring at least one aspect of said high-gain laser medium using a monitoring feedback system; and
adjusting said non-uniform current profile in response to said at least one aspect of said high-gain laser medium in real time.

17. The method of claim 12, further comprising:
controlling said thermal gradient across the periphery of said high-gain laser medium to provide a gradual thermal gradient;
emitting a laser beam from said high-gain medium;
monitoring at least one aspect of said laser beam using a monitoring feedback system; and
adjusting said non-uniform current profile in response to said at least one aspect of said laser beam in real time.

18. The method of claim 12, further comprising switching said signal processor for partitioning said electric current among various non-uniform current profiles contained within a plurality of predetermined non-uniform current profiles in real time.

19. The method of claim 12, wherein said pumping array comprises a two-dimensional array of laser diodes.

20. The method of claim 12, wherein said laser diodes comprise laser diode bars.

* * * * *